(12) United States Patent
Lai

(10) Patent No.: US 9,252,231 B2
(45) Date of Patent: Feb. 2, 2016

(54) SEMICONDUCTOR STRUCTURE AND MANUFACTURING METHOD FOR THE SAME

(71) Applicant: Macronix International Co., Ltd., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/301,414

(22) Filed: Jun. 11, 2014

(65) Prior Publication Data
US 2015/0364564 A1 Dec. 17, 2015

(51) Int. Cl.
| | |
|---|---|
| H01L 21/4763 | (2006.01) |
| H01L 29/51 | (2006.01) |
| H01L 29/792 | (2006.01) |
| H01L 27/115 | (2006.01) |
| H01L 23/528 | (2006.01) |
| H01L 29/66 | (2006.01) |
| H01L 21/311 | (2006.01) |
| H01L 29/423 | (2006.01) |
| H01L 21/28 | (2006.01) |

(52) U.S. Cl.
CPC ........ *H01L 29/513* (2013.01); *H01L 21/28282* (2013.01); *H01L 21/31111* (2013.01); *H01L 23/528* (2013.01); *H01L 27/11568* (2013.01); *H01L 27/11582* (2013.01); *H01L 29/4234* (2013.01); *H01L 29/66833* (2013.01); *H01L 29/7926* (2013.01)

(58) Field of Classification Search
CPC .............. H01L 27/11514; H01L 27/11521
USPC ........................................................ 438/620
See application file for complete search history.

(56) References Cited

U.S. PATENT DOCUMENTS

| | | | | |
|---|---|---|---|---|
| 7,855,457 B2* | 12/2010 | Mizukami et al. | ............ | 257/758 |
| 2012/0300547 A1* | 11/2012 | Choi | ......... | 365/185.05 |
| 2013/0148398 A1* | 6/2013 | Baek et al. | ....... | 365/51 |
| 2013/0153979 A1* | 6/2013 | Noh et al. | ..... | 257/314 |
| 2013/0334589 A1* | 12/2013 | Ahn | .............. | 257/324 |

* cited by examiner

*Primary Examiner* — Reema Patel
*Assistant Examiner* — Syed Gheyas
(74) *Attorney, Agent, or Firm* — McClure, Qualey & Rodack, LLP

(57) ABSTRACT

A semiconductor structure and a manufacturing method of the same are provided. The semiconductor structure includes a conductive layer, a conductive architecture and a dielectric layer. The conductive layer defines adjacent first openings. The conductive architecture surrounds a portion of the conductive layer between the first openings. The dielectric layer separates the conductive layer and the conductive architecture.

9 Claims, 8 Drawing Sheets

SEMICONDUCTOR STRUCTURE AND MANUFACTURING METHOD FOR THE SAME

BACKGROUND

1. Technical Field

The disclosure relates in general to a semiconductor structure and a manufacturing method thereof, and particularly to a memory and a manufacturing method thereof.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need.

As such, it is desirable to develop a three-dimensional (3D) memory device with larger number of multiple stacked planes to achieve greater storage capacity, a small size, and yet having excellent property and stability.

SUMMARY

According to an embodiment of the present disclosure, a semiconductor structure is provided. The semiconductor structure comprises a conductive layer, a conductive architecture and a dielectric layer. The conductive layer defines adjacent first openings. The conductive architecture surrounds a portion of the conductive layer between the first openings. The dielectric layer separates the conductive layer and the conductive architecture.

According to another embodiment of the present disclosure, a semiconductor structure is provided. The semiconductor structure comprises stacked conductive strips, a conductive architecture, and a dielectric layer. The conductive architecture surrounds the conductive strips. The dielectric layer separates the conductive strips and the conductive architecture.

According to yet another embodiment of the present disclosure, a method for manufacturing a semiconductor structure is provided. The method comprises following steps. Insulating layers and conductive layers are stacked alternately. First openings are formed to pass through the insulating layers and the conductive layers. Portions of the insulating layers exposed by the first openings are removed to form second openings in the insulating layer and bigger than the first openings. A dielectric layer is formed to cover portions of the conductive layers exposed by the first openings and the second openings. Conductive architectures are formed on the dielectric layer.

The above and other embodiments of the disclosure will become better understood with regard to the following detailed description of the non-limiting embodiment(s). The following description is made with reference to the accompanying drawings.

DETAILED DESCRIPTION

FIG. 1A to FIG. 5C illustrate a process for manufacturing method for a semiconductor structure according to one embodiment. The figures marked with "A" are top views of the semiconductor structure. The figures marked with "B" are cross-section views of the semiconductor structure along BB line and CC line, respectively.

Figure 1A:
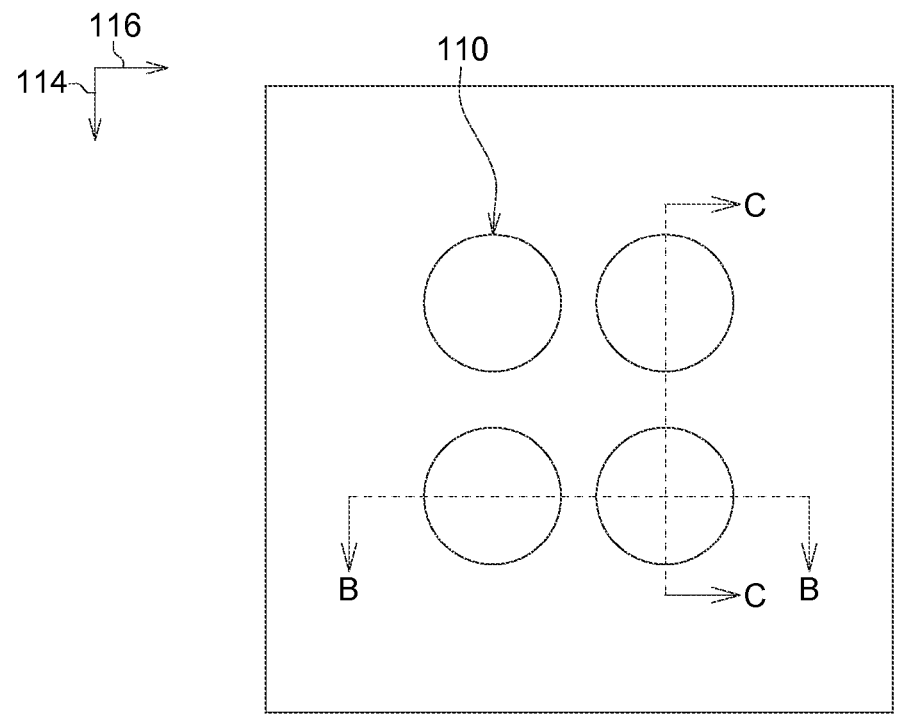
FIG. 1A to FIG. 5C illustrate a process for manufacturing method for a semiconductor structure according to one embodiment.
Figure 1B:
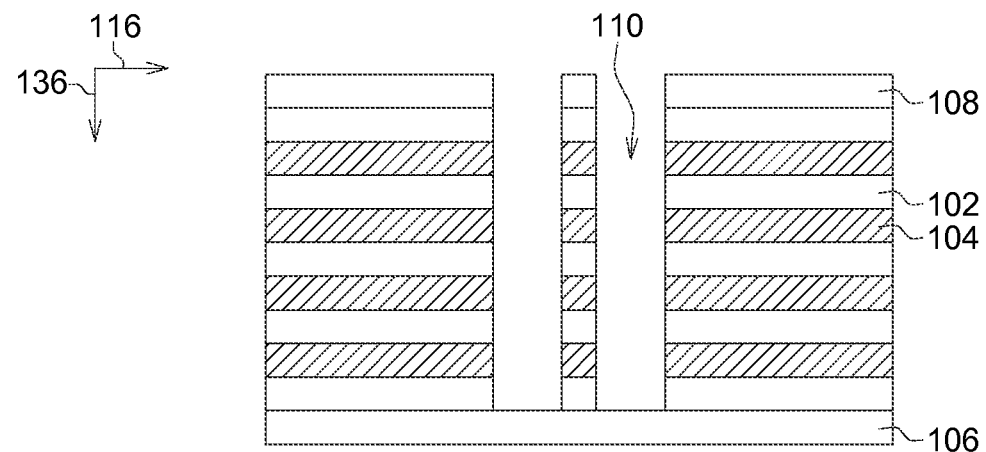
Figure 1C:
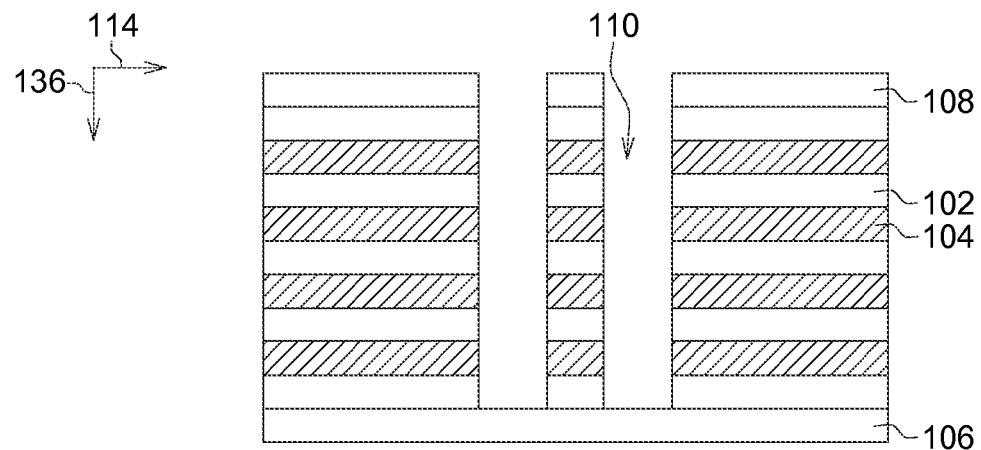

Referring to FIG. 1A to FIG. 1C, insulating layers 102 and conductive layers 104 are alternately stacked on a semiconductor substrate 106. The semiconductor substrate 106 may comprise silicon, SOI, or other suitable materials or structures. The insulating layer 102 may comprise an oxide, a nitride, an oxynitride, such as silicon oxide, silicon nitride, silicon oxynitride, or other suitable dielectric materials. The conductive layers 104 (such as un-doped polysilicon) and the insulating layers 102 (such as silicon oxide) exposed by a hard mask 108 (such as silicon nitride) of the top layer the may be removed to define first openings 110 in the conductive layers 104 and the insulating layers 102 by an etching process comprising a wet etching, a dry etching, or other suitable methods.

Figure 2A:
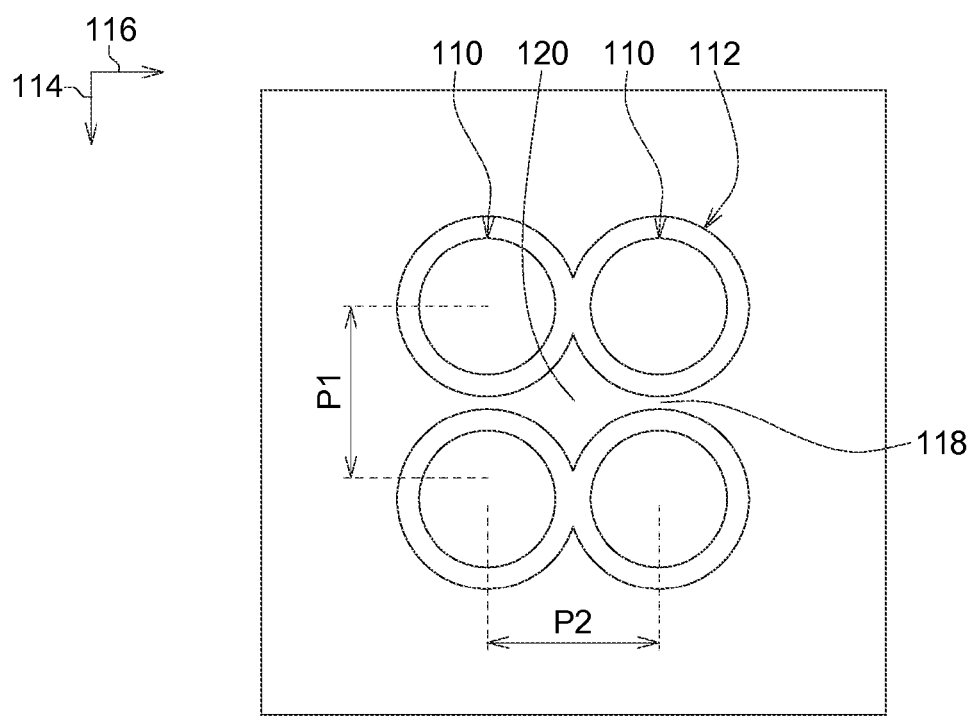
Figure 2B:
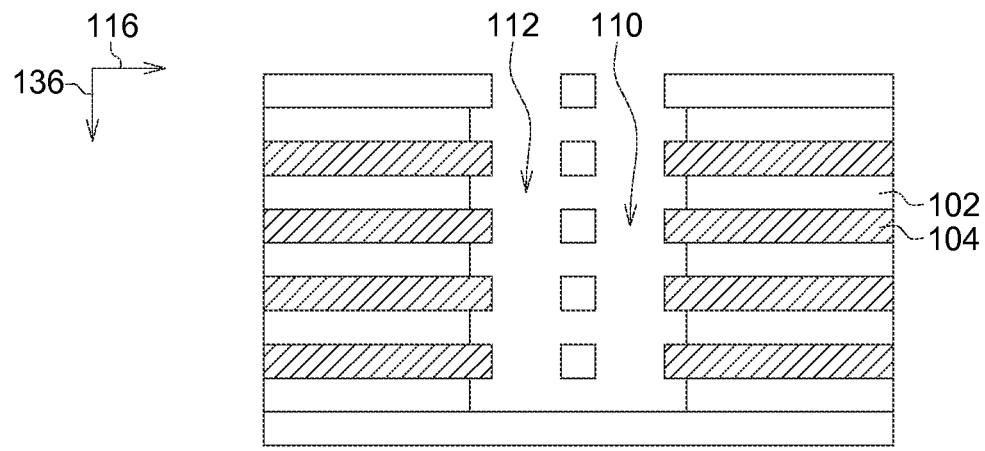
Figure 2C:
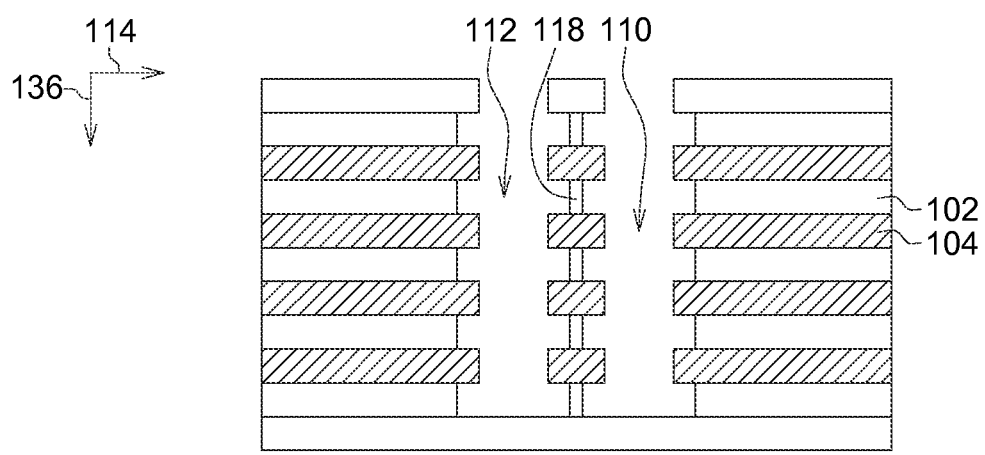

Referring to FIG. 2A to FIG. 2C, portions of the insulating layer 102 exposed by the first openings 110 are removed to define out second openings 112 in the insulating layer 102, bigger than the first openings 110 of the conductive layer 104, and communicated with the first openings 110, by an etching process. The etching process for the second openings 112 has an etching selectivity to the insulating layer 102 higher than an etching selectivity to the conductive layer 104. In other words, the etching process etches the insulating layer 102 with an etching rate faster than an etching rate to the conductive layer 104, or etches none of the conductive layer 104 substantially. For example, the insulating layer 102 of oxide may be removed by using DHF, BOE, or other suitable etchants. In one embodiment, a pitch P1 of the first openings 110 in a first direction 114 is bigger than a pitch P2 of the first openings 110 in a second direction 116, and the etching process is controlled (for example, by adjusting an etching time of an isotropic etching process) to removed a portion of specific size of the insulating layer 102, so as to remain a portion 118 (FIG. 2A and FIG. 2C) of the insulating layer 102 between the first openings 110 in the first direction 114, and communicate the first openings 110 in the second direction 116 (as shown in FIG. 2A and FIG. 2B, thereby forming the second openings 112 separated from each other in the first direction 114 (FIG. 2A and FIG. 2C), and in a shape type that communicates the different first openings 110 in the second direction 116 at the same time (FIG. 2A and FIG. 2B). In embodiments, after the second openings 112 are formed, an insulating portion 120 (FIG. 2A) of the insulating layer 102 is remained between adjacent four of the first openings 110. The insulating portion 120 can support the upper and lower conductive layers 104 to keep separating state from each other, and avoid an un-desired short circuit resulting from bending and collapsing of the conductive layers 104.

Figure 3A:
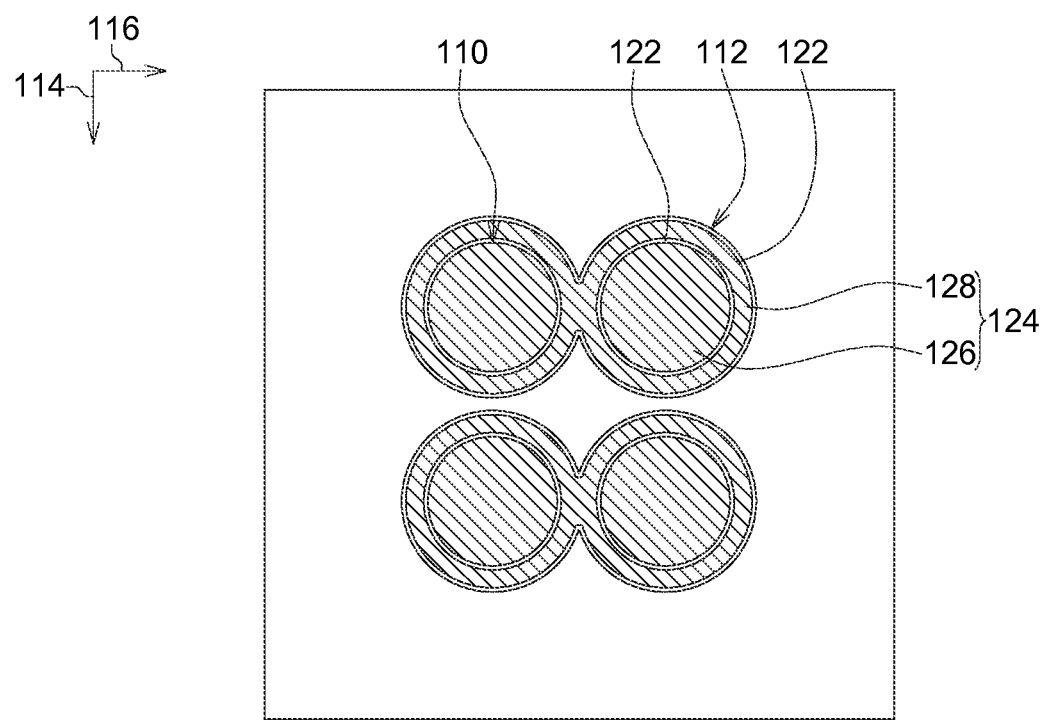
Figure 3B:
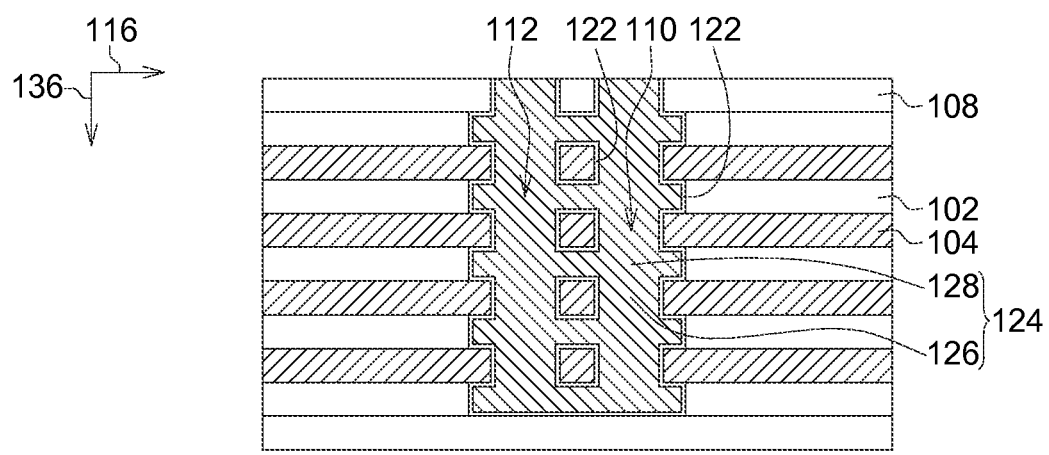
Figure 3C:
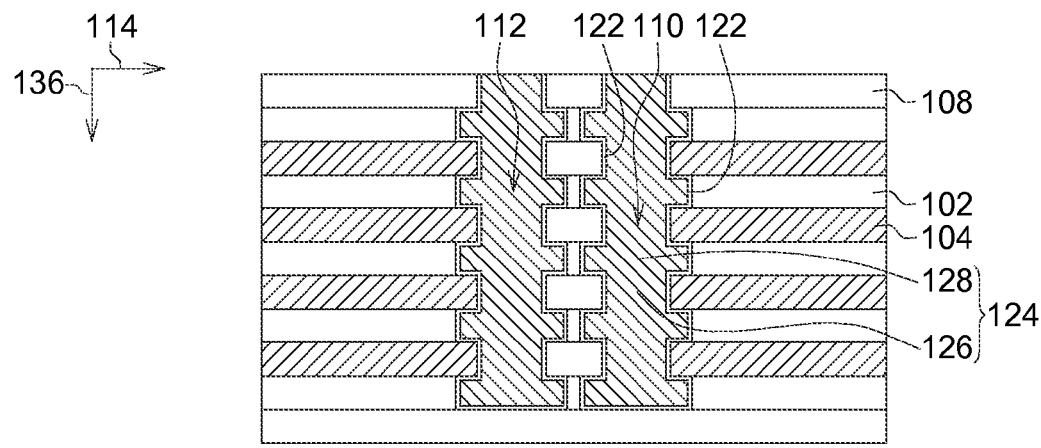

Referring to FIG. 3A to FIG. 3C, a dielectric layer 122 is formed to cover all of the conductive layers 104 and the insulating layers 102 exposed by the first openings 110 and the second openings 112. The first openings 110 of the conductive layer 104 and the second openings 112 of the insulating layers 102 are filled with a conductive material (such as P+ polysilicon, N+ polysilicon, TiN, TaN, W, Ti, Cu, or other conformal conductors) to form conductive architectures 124 on the dielectric layer 122. The conductive architecture 124 comprises first conductive portions 126 filling in the first openings 110, and a second conductive portion 128 filling in the second opening 112 and connecting the first conductive portions 126. The dielectric layer 122 and the conductive material on the hard mask 108 may be removed by a CMP process. The second conductive portion 128 is on and under the conductive layer 104. In addition, the dielectric layer 122 electrically isolates the conductive layer 104 and the conductive architecture 124, and electrically isolates the conductive architectures 124 from each other of different positions in the first direction 114.

Referring to FIG. 3B, the conductive architecture 124 surrounds upper and lower surfaces and opposing sidewalls of the conductive layer 104 between the first openings 110. One of the second conductive portions 128 overlaps the first conductive portions 126 in the different first openings 110.

Figure 4A:
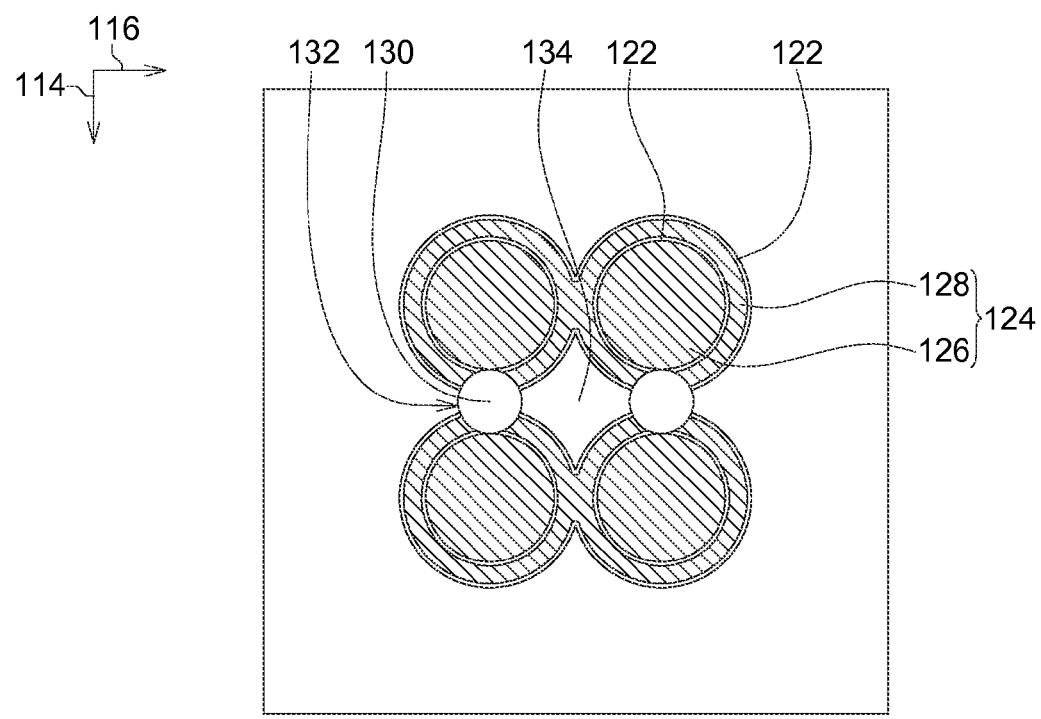
Figure 4B:
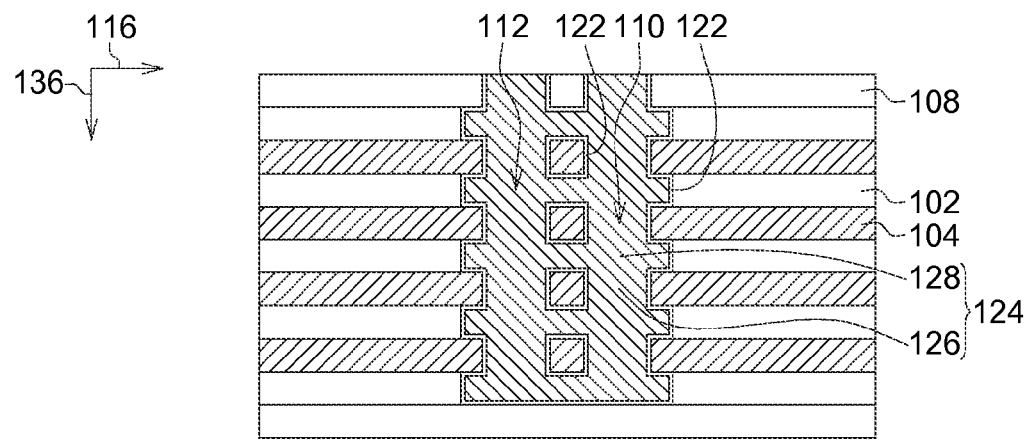
Figure 4C:
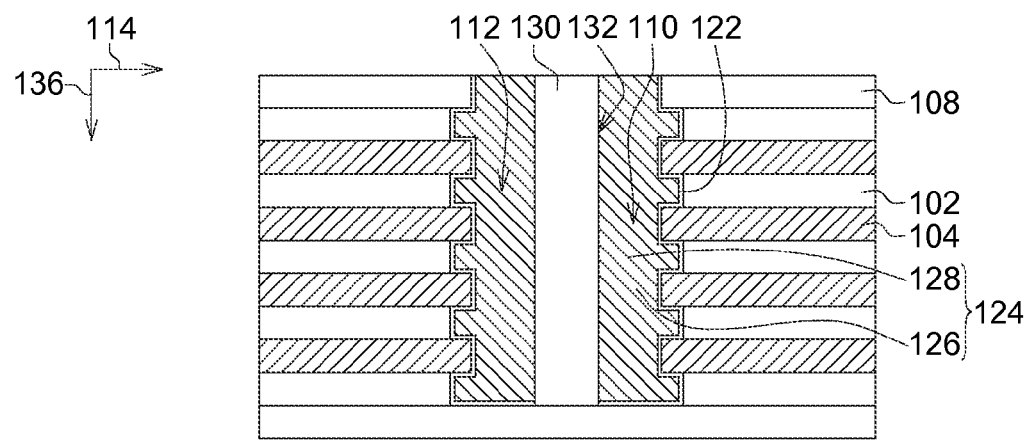
Figure 4D:
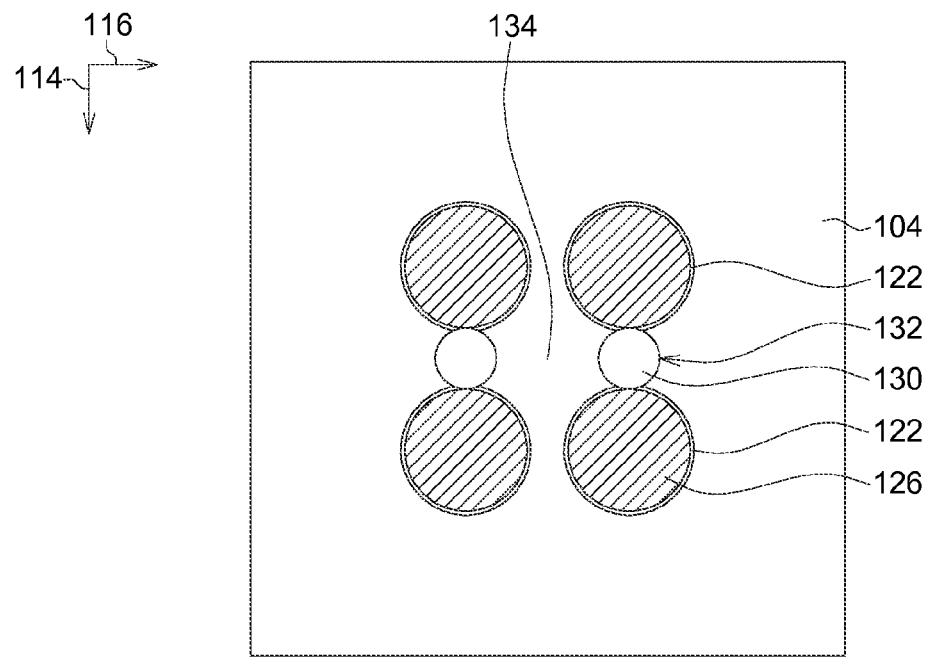

Referring to FIG. 4A to FIG. 4C, insulating plugs 130 are formed to pass through the conductive layers 104 and the insulating layers 102, to electrically isolating the conductive architectures 124. The insulating plugs 130 are formed by a method comprising defining third openings 132 in the conductive layers 104 and the insulating layers 102, and filling a dielectric material (such as an oxide) into the third openings 132. The dielectric material over the hard mask 108 may be removed by a CMP method. In one embodiment, the insulating plugs 130 are disposed between the first conductive portions 126 in the first direction 114, and adjoined (physically contact) with at least the dielectric layer 122 on the first conductive portion 126 (or in the first opening 110), so as to, with the dielectric layer 122, define a conductive strip 134 extending in the first direction 114 (FIG. 4D, showing arrangements of the elements of the single level of the conductive layer 104) in the conductive layer 104. In other embodiments, under the premise that electrical conduction of the conductive architecture 124 of different levels in a third direction 136 (vertical direction) is not influenced, the insulating plugs 130 may be further extended to touch the first conductive portions 126.

In the embodiments, the semiconductor structure is a 3D stack memory array having the conductive strip 134 functioned as bit lines extending along the first direction 114, and the conductive architectures 124 functioned as word lines extending along the second direction 116. For example, the dielectric layer 122 between the conductive strip 134 and the conductive architectures 124 may be an ONO structure, an ONONO structure, an ONONONO structure, or a multi-layer structure of tunneling material/trapping material/blocking material structure applied to a storage material for NAND. For example, O1N1O2 is for tunneling material, N2 is for trapping material, O3 or O3/N3/O4 is for blocking material. In one embodiment, the semiconductor structure uses a tantalum-alumina-nitride-oxide-silicon (TANOS) structure, comprising a Si substrate, an OX/SiN/Al2O3 dielectric, and a TaN gate.

As shown in FIG. 4B, the device has a gate-all-around (GAA) structure of the conductive architectures 124 (gate) surrounding the conductive strip 134 (bit line channel). This structure has a good gate-controlling ability and a high cell current, better than a double gate device or a single gate device. In addition, since the bit lines (the conductive strips 134) is surrounded by the gate, one of the bit lines would not be easily affected by another one of the bit lines during operating the device. Therefore, the coupling interference between the bit lines in Z direction would be reduced.

In some comparative examples, bit lines are formed a patterning method in which openings of long strip shape are defined in the conductive layers and the insulating layers. In other words, during the formation process, the whole of sidewalls of the bit lines are exposed to the openings, without being supported by other elements. However, in this condition, bending would easily occur to the bit lines of high aspect ratio due to other stress effect for example resulted from a solution filling in the openings, or dipping-in or pulling-out actions during a dip clean process. The bending damage would result in un-desired short circuit and reduce product yield.

In the embodiments of the present disclosure, the conductive strip 134 is formed by a method comprising patterning out the openings comprising the first openings 110 and the third openings 132. During the formation process, the material for the conductive strip 134 is supported. Therefore, compared to the comparative example, embodiment has a stronger structure characteristic that would not easily have bending problem, and higher reliability.

Figure 5A:
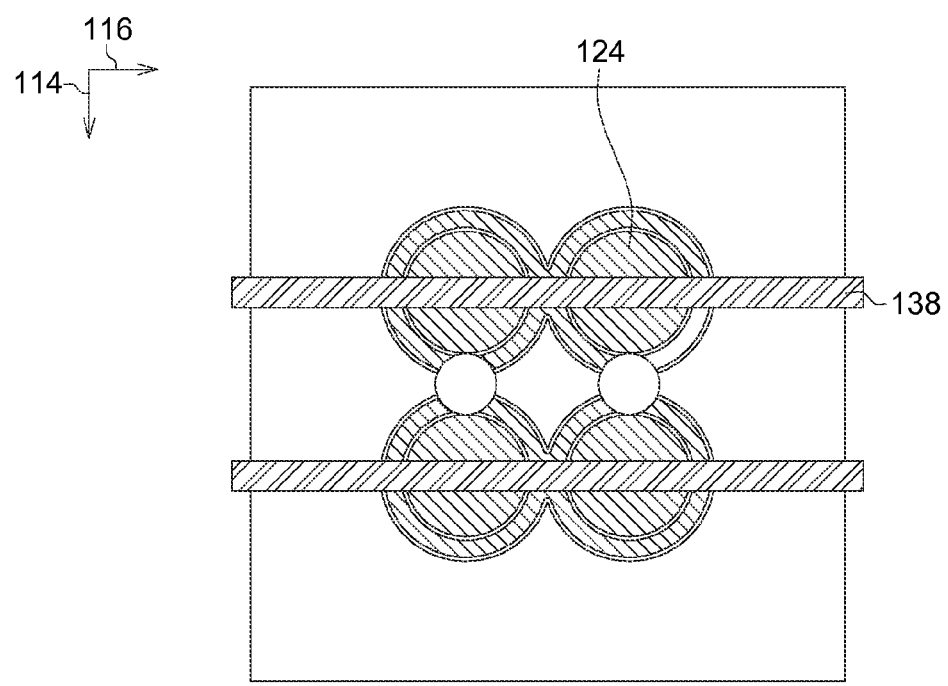
Figure 5B:
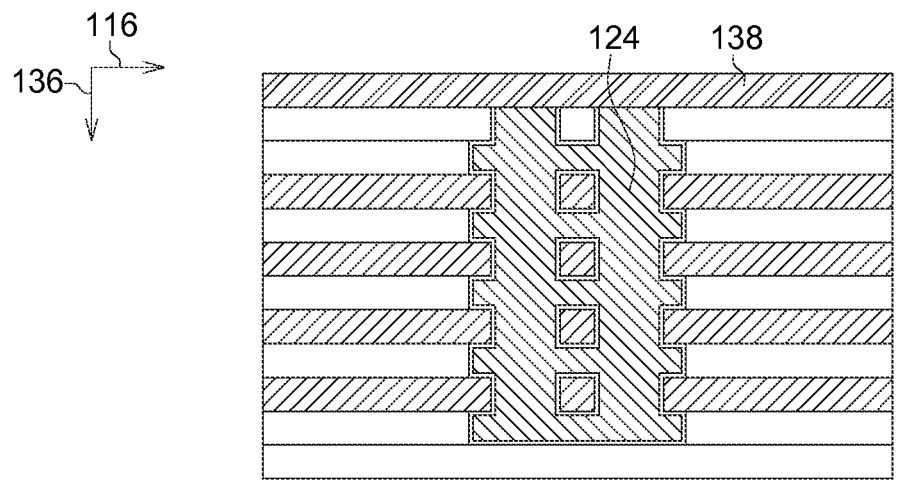
Figure 5C:
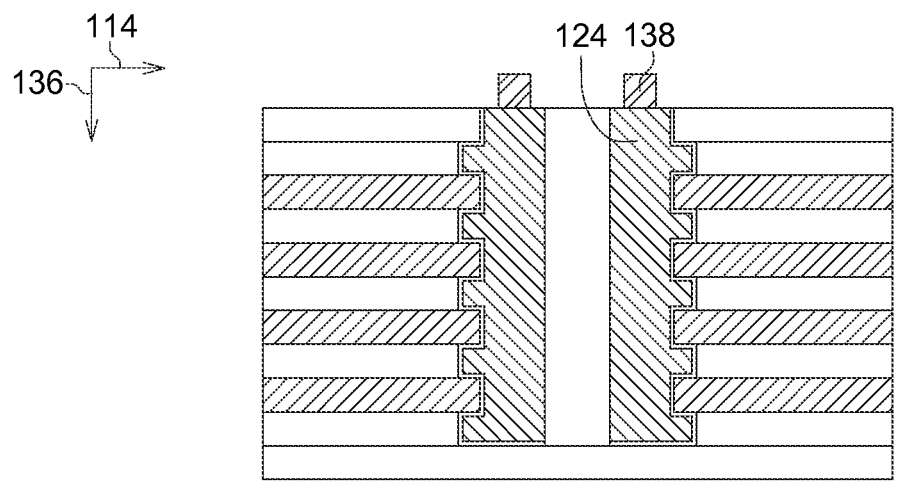

Referring to FIG. 5A to FIG. 5C, in some embodiments, conductive connections 138 such as word line connections extending in the second direction 116 and separated from each other on the conductive architectures 124. Other elements such as contact structures and ILD (not shown) may be formed.

The present disclosure is not limited to the illustrations according to the above embodiment drawings, and can be adjusted according to actual demands and other suitable designs.

For example, in embodiments, a number of the first conductive portions 126 (or the first openings 110) of the single level of the conductive layer 104 is not limited to 4 of 2×2 (for defining the one conductive strip 134 extending in the first direction 114) as shown in figures, and may use other numbers higher than 4 properly. For example, 9×8 (equal to 64) of the first conductive portions 126 may be used for defining 8 the conductive strips 134 extending in the first direction 114 and electrically separated from each other by the dielectric layer 122 and more the insulating plugs 130. For example, 9×16 (equal to 128) or other numbers of the first conductive portions 126 may be used. In the specific examples, one of 8 or 16 the second conductive portion 128 extending in the second direction 116 covers 9 the first conductive portions 126 at the same time, so as to form array device of more memory cells.

In some embodiments, the first openings 110 (FIG. 1A) may be designed as the pitch P1 in the first direction 114 equal to the pitch P2 in the second direction 116, and therefore the second opening 112 formed by the etching process would be a continuous opening extending not only in the second direction 116 (as shown in FIG. 2A) but also in the first direction 114 (not shown). Although this figure would result in the conductive architectures 124 of a shape continuously extending both in the first direction 114 and the second direction 116 (not shown), the memory device can still be obtained since the insulating plugs 130 are formed to segment the conductive architectures 124 into parts electrically isolated from each other and define out the bit lines in the second direction 116. In this case, the etching process for the second openings 112 is controlled to leave an insulating portion 120 (FIG. 2A) of the insulating layer 102 between adjacent four of the first openings 110. The insulating portion 120 can support the upper and lower conductive layers 104 to keep separating state from each other, and avoid an un-desired short circuit resulting from bending and collapsing of the conductive layers 104.

The dielectric layer 122 may use multi-layer structure and a single layer structure. In embodiments, the dielectric elements may comprise an oxide, a nitride, an oxynitride, such as silicon oxide, silicon nitride, silicon oxynitride, or other suitable dielectric materials. The conductive elements may comprise polysilicon, a metal such as TiN, Ti, TaN, Ta, Au, W, etc., or other suitable conductive materials.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a conductive layer defining adjacent first openings;
    a conductive architecture surrounding a portion of the conductive layer between the first openings, wherein the conductive architecture comprises:
    first conductive portions filling the first openings of the conductive layer; and
    a second conductive portion connecting the first conductive portions, and disposed on or under the conductive layer; and
    a dielectric layer separating the conductive layer and the conductive architecture.

2. The semiconductor structure according to claim 1, wherein the single second conductive portion overlaps the first conductive portions.

3. The semiconductor structure according to claim 1, further comprising an insulating layer disposed on or under the conductive layer, and defining a second opening, wherein the second conductive portion of the conductive architecture fills the second opening of the insulating layer.

4. The semiconductor structure according to claim 1, which is a gate-all-around (GAA) structure.

5. The semiconductor structure according to claim 1, comprising:
    a plurality of the conductive architectures; and
    insulating plugs electrically isolating the conductive architectures.

6. The semiconductor structure according to claim 1, wherein the first conductive portions are separated from each other, a pitch of the first conductive portions in a first direction is equal to or larger than a pitch of the first conductive portions in a second direction perpendicular to the first direction.

7. The semiconductor structure according to claim 1, further comprising insulating plugs, wherein the first conductive portions are separated from each other,
    the insulating plugs are between the first conductive portions in a first direction, a conductive strip extending along the first direction is defined in the conductive layer by the insulating plugs and the dielectric layer.

8. The semiconductor structure according to claim 1, wherein the conductive architecture surrounds upper and lower surfaces and opposing sidewalls of the conductive layer between the first openings.

9. The semiconductor structure according to claim 1, which is a 3D stack memory array.

* * * * *